(12) United States Patent
Song et al.

(10) Patent No.: US 11,980,109 B2
(45) Date of Patent: May 7, 2024

(54) SELECTION ELEMENT-INTEGRATED PHASE-CHANGE MEMORY AND METHOD FOR PRODUCING SAME

(71) Applicant: Samsung Electronics Co., Ltd., Suwon-si (KR)

(72) Inventors: Yun Heub Song, Seoul (KR); Jae Kyeong Jeong, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 493 days.

(21) Appl. No.: 17/051,268

(22) PCT Filed: May 23, 2019

(86) PCT No.: PCT/KR2019/006229
§ 371 (c)(1),
(2) Date: Oct. 28, 2020

(87) PCT Pub. No.: WO2019/226000
PCT Pub. Date: Nov. 28, 2019

(65) Prior Publication Data
US 2021/0376233 A1    Dec. 2, 2021

(30) Foreign Application Priority Data

| May 24, 2018 | (KR) | 10-2018-0059057 |
| May 29, 2018 | (KR) | 10-2018-0061256 |
| Dec. 18, 2018 | (KR) | 10-2018-0164317 |

(51) Int. Cl.
*H10N 70/20* (2023.01)
*H10B 63/00* (2023.01)
*H10N 70/00* (2023.01)

(52) U.S. Cl.
CPC .......... *H10N 70/231* (2023.02); *H10B 63/20* (2023.02); *H10B 63/84* (2023.02); *H10N 70/8413* (2023.02); *H10N 70/8836* (2023.02)

(58) Field of Classification Search
CPC ...................................................... H10B 63/84
See application file for complete search history.

(56) References Cited

U.S. PATENT DOCUMENTS 8,124,968 B2    2/2012    Koo et al.
8,299,450 B2    10/2012    Ahn et al.
(Continued)

FOREIGN PATENT DOCUMENTS

CN        101615656 A    12/2009
CN        106098721 A    11/2016
(Continued)

OTHER PUBLICATIONS

KR Office Action dated Nov. 15, 2019 issued in corresponding KR Application No. 10-2018-0061256.
(Continued)

*Primary Examiner* — Mounir S Amer
(74) *Attorney, Agent, or Firm* — Harness, Dickey & Pierce, P.L.C.

(57) ABSTRACT

Provided are a selection element which does not need an intermediate electrode and thus has improved integration, a phase-change memory device having the selection element, and a phase-change memory implemented so that the phase-change memory device has a highly integrated three-dimensional architecture.

14 Claims, 21 Drawing Sheets

(56) References Cited

U.S. PATENT DOCUMENTS

| | | |
|---|---|---|
| 8,586,978 B2 | 11/2013 | Kim et al. |
| 8,847,186 B2 | 9/2014 | Redaelli et al. |
| 2007/0158862 A1 | 7/2007 | Lung |
| 2007/0184613 A1 | 8/2007 | Kim et al. |
| 2014/0361239 A1 | 12/2014 | Ramaswamy et al. |
| 2015/0008387 A1 | 1/2015 | Redaelli et al. |
| 2015/0333103 A1 | 11/2015 | Toh et al. |
| 2018/0301551 A1* | 10/2018 | Majhi ............... H01L 29/66356 |
| 2020/0013951 A1* | 1/2020 | Wu .................... H10N 70/8413 |
| 2020/0027961 A1* | 1/2020 | Kusayanagi ...... H01L 21/02194 |
| 2020/0168792 A1* | 5/2020 | Song .................. G11C 13/0097 |

FOREIGN PATENT DOCUMENTS

| | | | |
|---|---|---|---|
| JP | 2009-0045653 A | 3/2009 | |
| JP | 2011-139057 A | 7/2011 | |
| JP | 6225203 B2 | 11/2017 | |
| KR | 100745761 B1 | 8/2007 | |
| KR | 2008-0025637 A | 3/2008 | |
| KR | 2009-0045653 A | 5/2009 | |
| KR | 2011-0022250 A | 3/2011 | |
| KR | 2011-0086452 A | 7/2011 | |
| KR | 10-2012-0033910 A | 4/2012 | |
| KR | 2012-0097634 A | 9/2012 | |
| KR | 10-2012-0133677 A | 12/2012 | |
| KR | 2016-0018761 A | 2/2016 | |

OTHER PUBLICATIONS

KR Office Action dated May 7, 2020 issued in corresponding KR Application No. 10-2018-0164317.
KR Office Action dated May 22, 2020 issued in corresponding KR Application No. 10-2018-0061256.
International Search Report PCT/ISA/210 for International Application No. PCT/KR2019/006229 dated Sep. 24, 2019.
Zhu, Y. et al. "Ni-doped GST materials for high speed phase change memory applications." *Materials Research Bulletin* 64 (2015): pp. 333-336.
Korean Office Action dated Jan. 21, 2021 issued in corresponding Korean Appln. No. 10-2018-0061256.
Korean Notice of Allowance dated Nov. 26, 2020 issued in corresponding Korean Appln. No. 10-2018-0164317.
Chinese Office Action dated Oct. 23, 2023 issued in Chinese Patent Application No. 201980033781.5.

* cited by examiner

SELECTION ELEMENT-INTEGRATED PHASE-CHANGE MEMORY AND METHOD FOR PRODUCING SAME

CROSS-REFERENCE TO RELATED APPLICATIONS

This application is a national phase under 35 U.S.C. § 371 of PCT International Application No. PCT/KR2019/006229 which has an International filing date of May 23, 2019, which claims priority to Korean Patent Application No. 10 2018 0164317, filed Dec. 18, 2018, Korean Patent Application No. 10-2018-0061256, filed May 29, 2018, and Korean Patent Application No. 10-2018-0059057, filed May 24, 2018, the entire contents of each of which are hereby incorporated by reference.

TECHNICAL FIELD

The present disclosure relates to a selection element-integrated phase-change memory and a method of producing the same, and more particularly, to a technology for a phase-change memory including a selection element-integrated phase-change element.

BACKGROUND ART

As IT technologies have been rapidly developed, there is a need for next generation memory devices having characteristics such as ultra-high speed, large capacity, and high integration appropriate for the development of portable information communication systems and devices that wirelessly process a large amount of information. Therefore, a three-dimensional V-NAND memory having highest integration has been implemented. However, it is expected that the string height will increase toward higher stages, and the three-dimensional V-NAND memory has a limitation in implementation of ultra-high integration thereof due to the difficulty in a process of forming the same to a high stage of 100 or more stages.

To replace this, next generation memory devices, such as STT-MRAM, FeRAM, ReRAM, and PCRAM having high-quality characteristics of power, and retention and write/read of data compared to general memory devices, have been studied.

In PCRAM (hereinafter referred to as a phase-change memory) from among the above memories, as a phase-change material layer is supplied with heat generated due to a current flow or a difference in an applied voltage between a first electrode and a second electrode, a crystal state of the phase-change material layer is changed between crystalline and amorphous. As a result, the phase-change material layer has low resistance when the crystal state thereof is crystalline and has high resistance when the crystal state thereof is amorphous, thereby showing a binary value corresponding to each resistance state (for example, when the phase-change material layer has low resistance in the crystalline crystal state, the phase-change material layer shows a set state of binary value [0], and, when the phase-change material layer has high resistance in the amorphous crystal state, the phase-change material layer shows a reset state of binary value [1]).

Because a phase-change memory as described above may be produced at low cost and operate at a high speed, the phase-change memory has been actively studied as a next generation semiconductor memory device and has been provided as a structure that is implemented with various three-dimensional architectures to improve the limitation of two-dimensional phase scaling.

However, an existing OTS used as a selection element in a phase-change memory needs an intermediate electrode arranged in contact with a phase-change material layer and thus may not implement high integration in scaling and may have low material reliability due to a heat effect between phase-change materials according to scaling.

Therefore, there is a need for the development of a selection element to replace an existing OTS.

DESCRIPTION OF EMBODIMENTS

Technical Problem

Provided are a selection element having improved integration without needing an intermediate electrode, a phase-change memory device including the selection element, and a phase-change memory implemented so that the phase-change memory device has a highly integrated three-dimensional architecture.

Provided are also a selection element-integrated phase-change element which has a PN diode structure including a P-type phase-change material layer having a crystal state changing due to supplied heat and an N-type metal oxide layer contacting the P-type phase-change material layer, thereby functioning as memory cell through a phase change and functioning as a selection element for selectively switching heat to the phase-change material layer, a phase-change memory device including the selection element, and a phase-change memory implemented so that the phase-change memory device has a highly integrated three-dimensional architecture.

Provided are also a selection element-integrated phase-change element including a phase-change material layer which is formed of a compound, in which a transition metal is included in a phase-change material, to have a reverse phase-change characteristic in which the phase-change material layer has high resistance when a crystal state thereof is crystalline and has low resistance when the crystal state thereof is amorphous, a phase-change memory device including the selection element-integrated phase-change element, and a phase-change memory implemented so that the phase-change memory device has a highly integrated three-dimensional architecture.

Provided are also a phase-change memory device including a semiconductor material layer arranged between one of a first electrode or a second electrode and a phase-change material layer and operating as a selection element for the phase-change material layer by using Schottky diode characteristics of a contact interface with the one electrode, and a phase-change memory implemented so that the phase-change memory device has a highly integrated three-dimensional architecture.

Provided are also a phase-change memory device having a low leakage current characteristic by forming a PN diode structure of one electrode and a semiconductor material layer, and a phase-change memory implemented so that the phase-change memory device has a highly integrated three-dimensional architecture.

Solution to Problem

According to an aspect of the present disclosure, a selection element-integrated phase-change element used in a phase-change memory device may include: a P-type phase-change material layer having a crystal state changing due to heat supplied from a first electrode and a second electrode included in the phase-change memory device; and an N-type metal oxide layer contacting the phase-change material layer, wherein the selection element-integrated phase-change element is formed in a PN diode structure to selectively switch, to the phase-change material layer, heat supplied from the first electrode and the second electrode.

The metal oxide layer may be formed of an oxide semiconductor material including at least one cation of Zn, In, or Ga.

The metal oxide layer may be formed of a $ZnO_x$-based material.

The $ZnO_x$-based material may include at least one of AZO, ZTO, IZO, ITO, IGZO, or Ag—ZnO.

The phase-change material layer may be formed of a compound, in which a transition metal is included in a phase-change material, to have a reverse phase-change characteristic in which the phase-change material layer has high resistance when a crystal state thereof is crystalline and has low resistance when the crystal state thereof is amorphous.

A composition ratio in which the transition metal is included in the phase-change material is adjusted to maximize a resistance ratio of the phase-change material layer between when the crystal state thereof is crystalline and when the crystal state thereof is amorphous.

The phase-change material may include at least one of Ge, Sb, or Te, and the transition metal may include at least one of Cr, Ti, Ni, Zn, Cu or Mo.

According to another aspect of the present disclosure, a method of producing a selection element-integrated phase-change element used in a phase-change memory device may include: forming a P-type phase-change material layer having a crystal state changing due to heat supplied from a first electrode and a second electrode included in the phase-change memory device; and forming an N-type metal oxide layer so that the metal oxide layer contacts the phase-change material layer, wherein the selection element-integrated phase-change element is formed in a PN diode structure to selectively switch, to the phase-change material layer, heat supplied from the first electrode and the second electrode.

According to another aspect of the present disclosure, a selection element-integrated phase-change memory device may include: a first electrode and a second electrode; and a selection element-integrated phase-change element arranged between the first electrode and the second electrode, wherein the selection element-integrated phase-change element is formed in a PN diode structure including a P-type phase-change material layer having a crystal state changing due to heat supplied from the first electrode and the second electrode and an N-type metal oxide layer contacting the phase-change material layer, thereby selectively switching, to the phase-change material layer, heat supplied from the first electrode and the second electrode.

According to another aspect of the present disclosure, a phase-change memory having a highly integrated three-dimensional architecture, may include: at least one first electrode extending in a horizontal direction and a second electrode extending in a vertical direction with respect to the at least one first electrode; and at least one selection element-integrated phase-change element arranged between the at least one first electrode and the second electrode, wherein each of the at least one selection element-integrated phase-change element is formed in a PN diode structure including a P-type phase-change material layer having a crystal state changing due to heat supplied from the at least one first electrode and the second electrode and an N-type metal oxide layer contacting the phase-change material layer, thereby selectively switching, to the phase-change material layer, heat supplied from the at least one first electrode and the second electrode.

According to another aspect of the present disclosure, a method of producing a phase-change memory having a highly integrated three-dimensional architecture may include: preparing a structure in which at least one insulating layer and at least one first electrode extending in a horizontal direction are alternately stacked; forming, in the structure, a vertical hole in a vertical direction with respect to the at least one first electrode; etching a portion of the at least one first electrode exposed on an inner surface of the vertical hole; forming a selection element-integrated phase-change element in a PN diode structure in a space formed by etching the portion of the at least one first electrode and on the inner surface; and filling a second electrode in the vertical hole in which the selection element-integrated phase-change element is formed, wherein the forming the selection element-integrated phase-change element includes: filling a P-type phase-change material layer in each space formed by etching the portion of the at least one first electrode; and forming an N-type metal oxide layer on the inner surface of the vertical hole so that the metal oxide layer contacts the phase-change material layer.

According to another aspect of the present disclosure, a phase-change memory device may include: a first electrode; a second electrode; a phase-change material layer between the first electrode and the second electrode; and a semiconductor material layer arranged between one of the first electrode or the second electrode and the phase-change material layer and operating as a selection element for the phase-change material layer by using Schottky diode characteristics of a contact interface with the one electrode.

The one electrode and the semiconductor material layer may form a PN diode structure to selectively switch, to the phase-change material layer, heat supplied from the first electrode and the second electrode.

The one electrode and the semiconductor material layer may have a PN diode structure as the one electrode is formed P type and the semiconductor material layer is formed N type.

The semiconductor material layer may be formed of an N-type oxide semiconductor material including at least one cation of Zn, In, or Ga.

The semiconductor material layer may be formed of a $ZnO_x$-based material.

The $ZnO_x$-based material may include at least one of AZO, ZTO, IZO, ITO, IGZO, or Ag—ZnO.

According to another aspect of the present disclosure, a selection element used in a phase-change memory device including a first electrode, a second electrode, and a phase-change material layer between the first electrode and the second electrode may include a semiconductor material layer arranged between one of the first electrode or the second electrode and the phase-change material layer and selectively switching, to the phase-change material layer, heat supplied from the first electrode and the second electrode by using Schottky diode characteristics of a contact interface with the one electrode.

According to another aspect of the present disclosure, a phase-change memory having a highly integrated three-dimensional architecture may include: at least one first electrode extending in a horizontal direction and a second electrode extending in a vertical direction with respect to the at least one first electrode; at least one phase-change material layer between the at least one first electrode and the second electrode; and at least one semiconductor material layer arranged between one of the at least one first electrode or the second electrode and the at least one phase-change material layer and operating as a selection element for the at least one phase-change material layer by using Schottky diode characteristics of a contact interface with the one electrode.

Advantageous Effects of Disclosure

One or more embodiments may provide a selection element which does not need an intermediate electrode and thus has improved integration, a phase-change memory device including the selection element, and a phase-change memory implemented so that the phase-change memory device has a highly integrated three-dimensional architecture.

In more detail, one or more embodiments may provide a selection element-integrated phase-change device which has a PN diode structure including a P-type phase-change material layer having a crystal state changing due to supplied heat and an N-type metal oxide layer contacting the P-type phase-change material layer, thereby functioning as a memory cell through a phase change and functioning as a selection element for selectively switching heat to the phase-change material layer, a phase-change memory device including the selection element-integrated phase-change device, and a phase-change memory implemented so that the phase-change memory device has a highly integrated three-dimensional architecture.

Here, one or more embodiments may provide a selection element-integrated phase-change device including a phase-change material layer formed of a compound, in which a transition metal is included in a phase-change material, to have a reverse phase-change characteristic in which the phase-change material layer has high resistance when a crystal state thereof is crystalline and has a low resistance when the crystal state thereof is amorphous, a phase-change memory device including the selection element-integrated phase-change device, and a phase-change memory implemented so that the phase-change memory device has a highly integrated three-dimensional architecture.

In addition, one or more embodiments may provide a phase-change memory device including a semiconductor material layer arranged between one of a first electrode or a second electrode and a phase-change material layer and operating as a selection element for the phase-change material by using Schottky diode characteristics of a contact interface with the one electrode, and a phase-change memory implemented so that the phase-change memory device has a highly integrated three-dimensional architecture.

Here, one or more embodiments may provide a phase-change memory device having a low leakage current characteristic by forming a PN diode structure of one electrode and a semiconductor material layer, and a phase-change memory implemented so that the phase-change memory device has a highly integrated three-dimensional architecture.

BEST MODE

Figure 1:
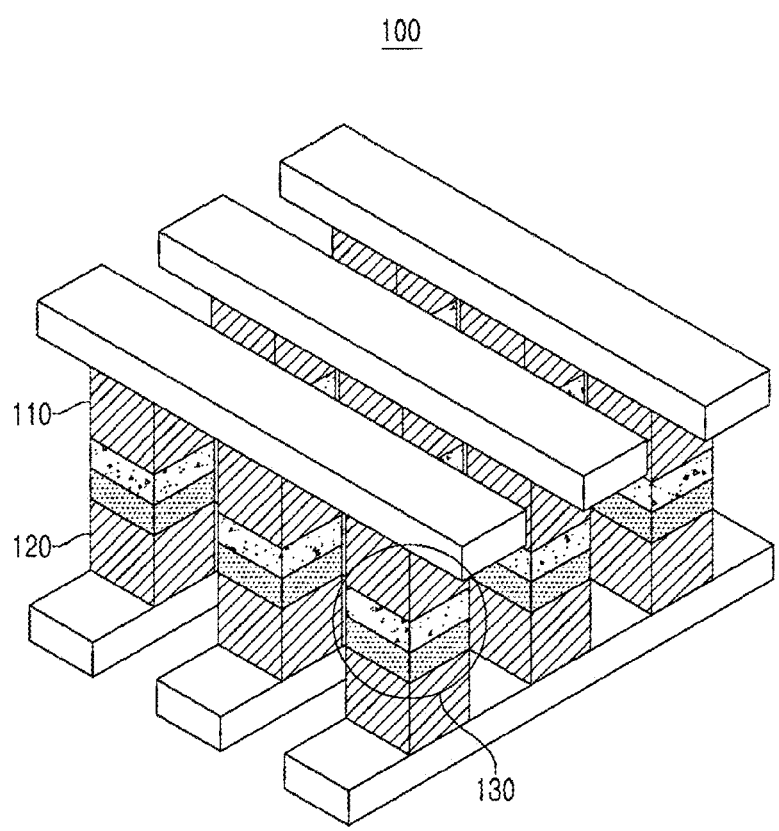
FIG. 1 is a view showing a phase-change memory device according to an embodiment.

Hereinafter, embodiments will be described in detail with reference to the accompanying drawings. However, the present disclosure is not limited or restricted by the embodiments. Also, like reference numerals in the drawings denote like elements.

In addition, the terminology used herein are used to appropriately express example embodiments of the present disclosure and may vary according to the intention of a user or an operator or judicial precedent in the field to which the present disclosure pertains. Accordingly, the present terminology should be defined on the basis of the contents throughout.

Figure 2:
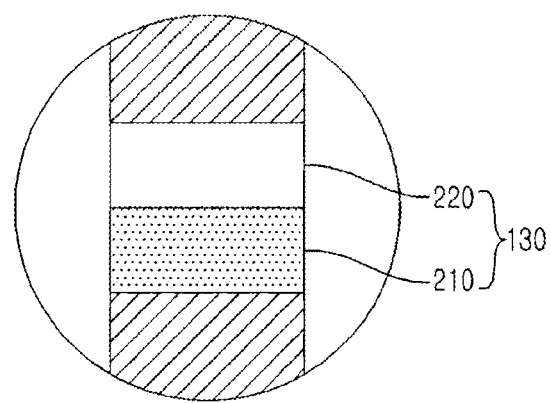
FIG. 2 is a view showing a selection element-integrated phase-change device included in the phase-change memory device shown in FIG. 1.
Figure 3:
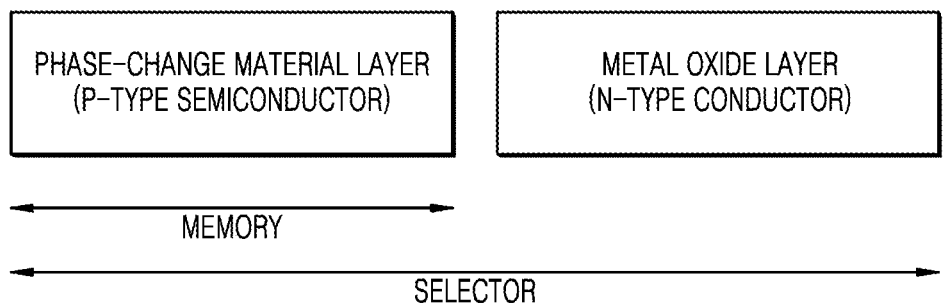
FIG. 3 is a conceptual view for explaining a selection element-integrated phase-change device according to an embodiment.

FIG. 1 is a view showing a phase-change memory device according to an embodiment. FIG. 2 is a view showing a selection element-integrated phase-change element included in the phase-change memory device shown in FIG. 1. FIG. 3 is a conceptual view for explaining a selection element-integrated phase-change element according to an embodiment.

Referring to FIGS. 1 through 3, a phase-change memory device 100 according to an embodiment includes a first electrode 110, a second electrode 120, and a selection element-integrated phase-change element 130.

Each of the first electrode 110 and the second electrode 120 may be formed of a metal material having conductivity such as W, TaN, or TiN. The first electrode 110 and the second electrode 120 are arranged on and underneath the selection element-integrated phase-change element 130 and thus may be referred to as a top electrode and a bottom electrode, respectively.

The selection element-integrated phase-change element 130 is arranged between the first electrode 110 and the second electrode 120, and thus, may function as a memory cell having a crystal state changing due to heat supplied from the first electrode 110 and the second electrode 120 and function as a selection element for selectively switching the corresponding heat.

In more detail, referring to FIG. 2, the selection element-integrated phase-change element 130 may include a P-type phase-change material layer 210 having a crystal state changing due to heat supplied from the first electrode 110 and the second electrode 120 and an N-type metal oxide layer 220 contacting the phase-change material layer 210. Therefore, the selection element-integrated phase-change element 130 may be formed in a PN diode structure and thus selectively switch, to the phase-change material layer 210, heat supplied from the first electrode 110 and the second electrode 120.

In other words, as shown in FIG. 3, the selection element-integrated phase-change element 130 according to an embodiment may function as a memory cell in the phase-change material layer 210 and function as a selection element.

In the selection element-integrated phase-change element 130 formed in the PN diode structure as described above, the P-type phase-change material layer 210 may be constituted to have a reverse phase-change characteristic for stable P-type semiconductor characteristics (to maintain a high resistance state even in a crystal state). For example, the P-type phase-change material layer 210 may be formed of a compound, in which a transmission metal is included in a phase-change material, to have a reverse phase-change characteristics in which the phase-change material layer 210 has high resistance when a crystal state thereof is crystalline and has low resistance when the crystal state thereof is amorphous. Having high resistance when the crystal state of the phase-change material layer 210 is crystalline indicates having relatively high resistance on the basis of resistance obtained when the crystal state of the phase-change material layer 210 is amorphous, and having low resistance when the crystal state of the phase-change material layer 210 is amorphous indicates having relatively low resistance obtained when the crystal state of the phase-change material layer 210 is crystalline. In other words, having high resistance or low resistance according to the crystal state of the phase-change material layer 20 may indicate that relatively compared resistance values are high or low.

Here, the phase-change material is a material having a phase-change characteristic in which the phase-change material has low resistance when a crystal state thereof is crystalline and has high resistance when the crystal state thereof is amorphous and may be, for example, a material including at least one of Ge, Sb, or Te. The transition metal may be a material including at least one of Cr, Ti, Ni, Zn, Cu, and/or Mo.

Here, a composition ratio in which the transition metal is included in the phase-change material may be adjusted to maximize a resistance ratio of the phase-change material layer 210 between when the crystal state thereof is crystalline and when the crystal state thereof is amorphous. For example, a composition ratio in which a transition metal such as Cr (or Ti, Ni, Zn, Cu, or Mo) is included in a phase-change material such as Ge and Te may be adjusted to have a weight percentage less than 10% on the basis of Ge and Te to thereby maximize a resistance ratio of the phase-change material layer 210 between when the crystal state thereof is crystalline and when the crystal state thereof is amorphous.

Figure 4:
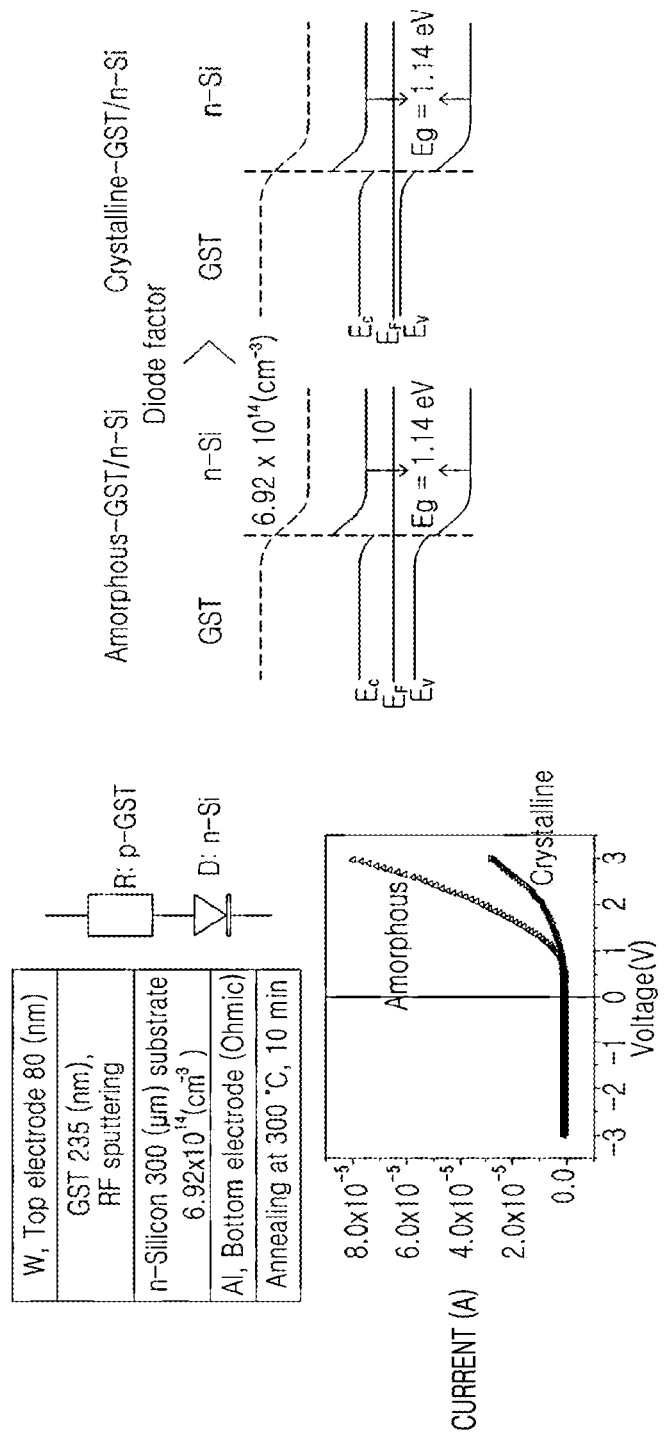
FIG. 4 is a view showing a phase-change memory device including an existing OTS.

Referring to FIG. 4 for explaining drawbacks of an existing phase-change memory device, in the existing phase-change memory device, a phase-change material layer is formed of merely a phase-change material having a phase-change characteristic in which the phase-change material has low resistance when a crystal state thereof is crystalline and has high resistance when the crystal state thereof is amorphous. Therefore, as shown in FIG. 4, the phase-change material layer shows a strong rectification characteristic in the amorphous state but, in the crystalline state, shows a weak rectification characteristic due to a barrier height which is lowered when bias is applied.

Figure 5:
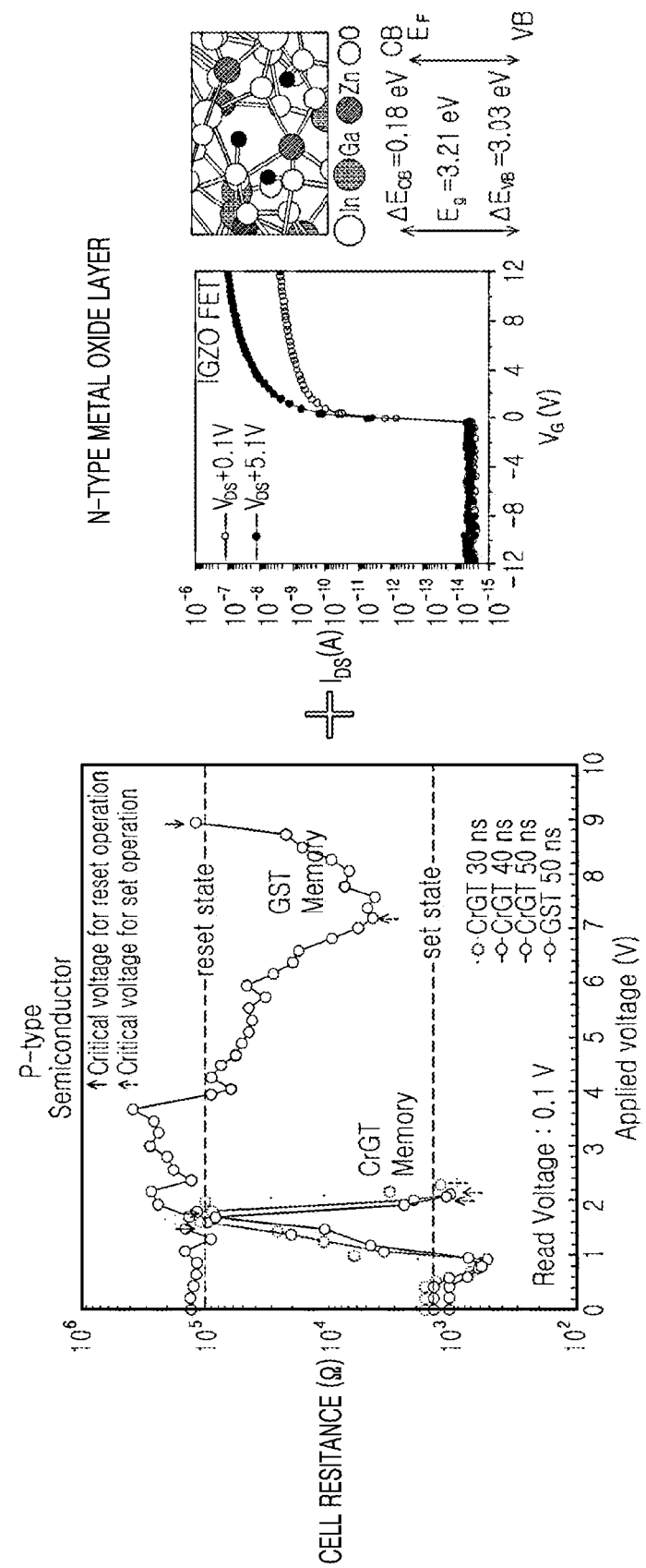
FIG. 5 is a view for explaining drawbacks of an existing phase-change memory device.

However, referring to FIG. 5 for explaining merits of a phase-change memory device including a selection element-integrated phase-change element according to an embodiment, in the selection element-integrated phase-change element 130 according to an embodiment, the phase-change material layer 210 is formed of a compound in which a transition metal is included in a phase-change material. Therefore, the phase-change material layer 210 has a reverse phase-change characteristic in which the phase-change material layer 210 has high resistance when a crystal state thereof is crystalline and has low resistance when the crystal state thereof is amorphous. As a result, the selection element-integrated phase-change element 130 may maintain a high resistance state even in a crystal state to solve the drawbacks of an existing phase-change memory device.

Also, in the selection element-integrated phase-change element 130 formed in the PN diode structure, the N-type metal oxide layer 220 may be formed of an oxide semiconductor material including at least one cation of Zn, In, or Ga having a low leakage current characteristic. For example, the selection element-integrated phase-change element 130 may be formed of a $ZnO_x$-based material, thereby achieving a high-quality leakage current characteristic with a wide band gap. Here, the $ZnO_x$-based material may be a material including at least one of AZO, ZTO, IZO, ITO, IGZO, or Ag—ZnO.

As described above, the selection element-integrated phase-change element 130 according to an embodiment may function as a memory cell having a crystal state changing due to heat supplied from the first electrode 110 and the second electrode 120 by forming the P-type phase-change material layer 210 having the reverse phase-change characteristic and simultaneously function as a selection element for selectively switching heat to the phase-change material layer 210 by having a PN diode structure in which stable and high-quality P-type semiconductor characteristics and N-type conductor characteristics are implemented.

Figure 6:
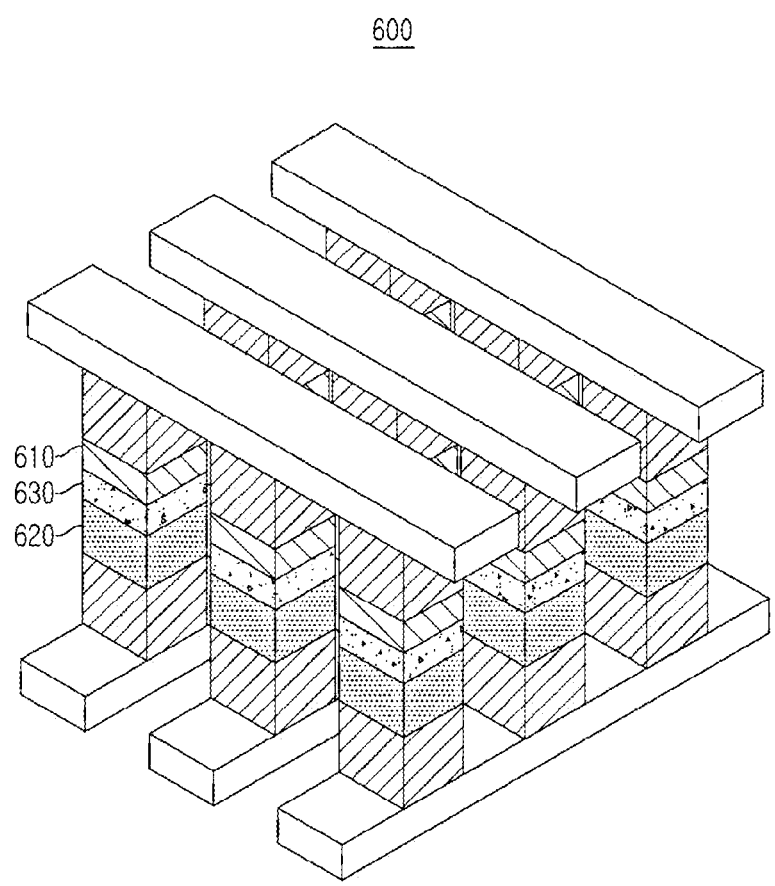
FIG. 6 is a view for explaining merits of a phase-change memory device including a selection element-integrated phase-change device, according to an embodiment.

Referring to FIG. 6 showing a phase-change memory device including an existing OTS, an existing phase-change memory device 600 includes an intermediate electrode 630 between an OTS 610 and a phase-change material layer 620, and thus, may not implement high integration in scaling and may have low material reliability due to scaling.

However, the selection element-integrated phase-change element 130 according to the above-described embodiment includes merely the P-type phase-change material layer 210 and the N-type metal oxide layer 220, and thus, the phase-change memory device 100 including the selection element-integrated phase-change element 130 may solve the drawbacks of an existing phase-change memory device.

Figure 7:
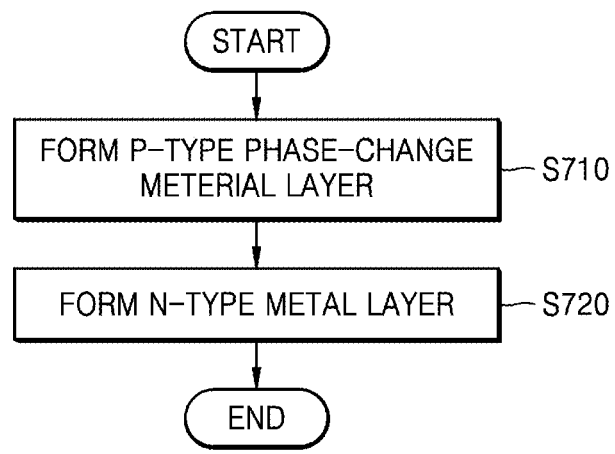
FIG. 7 is a flowchart showing a method of producing a selection element-integrated phase-change device, according to an embodiment.

FIG. 7 is a flowchart showing a method of producing a selection element-integrated phase-change element, according to an embodiment.

Referring to FIG. 7, the method of producing a selection element-integrated phase-change element according to an embodiment relates to a method of producing the selection element-integrated phase-change element described above with reference to FIGS. 1 through 3 and is performed by a production system.

In operation S710, the production system forms a phase-change material layer between a first electrode and a second electrode included in a phase-change memory device. In more detail, the production system may form a P-type phase-change material layer having a crystal state changing due to heat supplied from the first electrode and the second electrode.

In particular, in operation S710, the production system may form the phase-change material layer of a compound in which a transition metal (e.g., a material including at least one of Cr, Ti, Ni, Zn, Cu, and/or Mo) is included in a phase-change material (e.g., a material including at least one of Ge, Sb, or Te), so that the phase-change material layer has a reverse phase-change characteristic in which the phase-change material layer has high resistance when a crystal state thereof is crystalline and has low resistance when the crystal state thereof is amorphous. Here, the production system may adjust a composition ratio, in which the transition metal is included in the phase-change material, to maximize a resistance ratio of the phase-change material layer between when the crystal state thereof is crystalline and when the crystal state thereof is amorphous.

In operation S720, the production system may form an N-type metal oxide layer so that the metal oxide layer contacts the phase-change material layer. In detail, the production system may form the metal oxide layer of an oxide semiconductor material including at least one cation of Zn, In, or Ga. For example, the production system may form the metal oxide layer of a $ZnO_x$-based material (e.g., a material including at least one of AZO, ZTO, IZO, ITO, IGTO, or Ag—ZnO).

Therefore, a selection element-integrated phase-change element produced through operations S710 and S720 may have a PN diode structure, function as a memory cell having a crystal state changing due to heat, and function as a selection element for selectively switching heat to the phase-change material layer.

The method of producing the selection element-integrated phase-change element has been described above, but the phase-change memory device including the selection element-integrated phase-change element may be produced on the basis of operations S710 and S720. For example, before or after operations S710 and S720, an operation of forming a first electrode and a second electrode therebetween which the selection element-integrated phase-change element is sandwiched may be further performed to produce the phase-change memory device.

The selection element-integrated phase-change element described above and the phase-change memory device including the same have a simplified structure and may be implemented to have a highly integrated three-dimensional architecture. This will be described in detail below.

Figure 8:
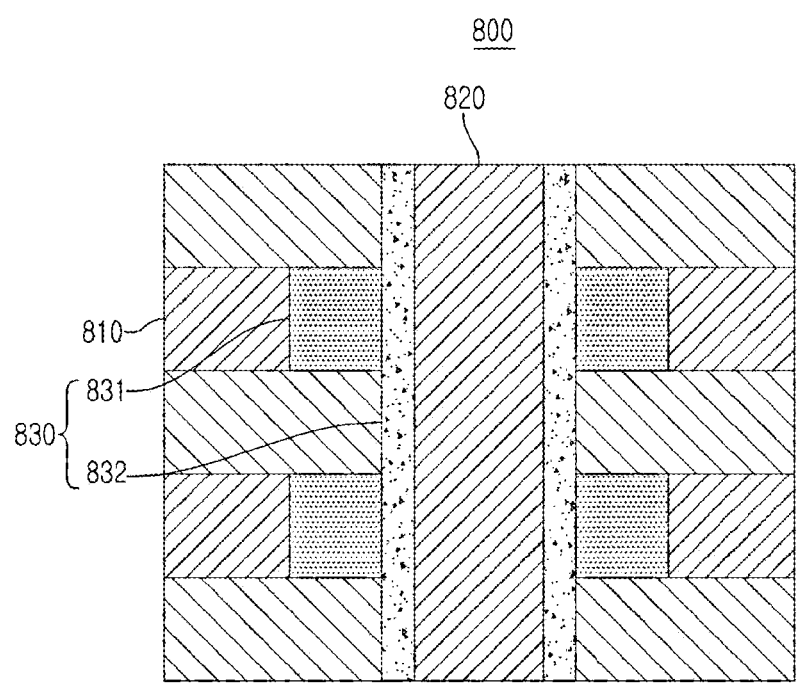
FIG. 8 is a view showing a phase-change memory implemented to have a highly integrated three-dimensional architecture while including a selection element-integrated phase-change device, according to an embodiment.

FIG. 8 is a view showing a phase-change memory implemented to have a highly integrated three-dimensional architecture while including a selection element-integrated phase-change element, according to an embodiment.

Referring to FIG. 8, a phase-change memory 800 includes at least one first electrode 810 extending in a horizontal direction, a second electrode 820 extending in a vertical direction with respect to the at least one first electrode 810, and at least one selection element-integrated phase-change element 830 which extends in the horizontal direction to contact the at least one first electrode 810 and is arranged between the at least one first electrode 810 and the second electrode 820.

In the phase-change memory 800 having the structure as described above, an area 830 corresponds to the phase-change memory device described above with reference to FIGS. 1 through 3. In other words, each of the at least one selection element-integrated phase-change element 830 may be formed in a PN diode structure including a P-type phase-change material layer 831 having a crystal state changing due to heat supplied from the at least one first electrode 810 and the second electrode 820 and an N-type metal oxide layer 832 contacting the phase-change material layer 831, thereby selectively switching, to the phase-change material layer 831, heat supplied from the at least one first electrode 810 and the second electrode 820.

The detailed description of each of the at least one selection element-integrated phase-change element 830 including the P-type phase-change material layer 831 and the N-type metal oxide layer 832 is as described above with reference to FIGS. 1 through 3 and thus will be omitted herein.

Figure 9:
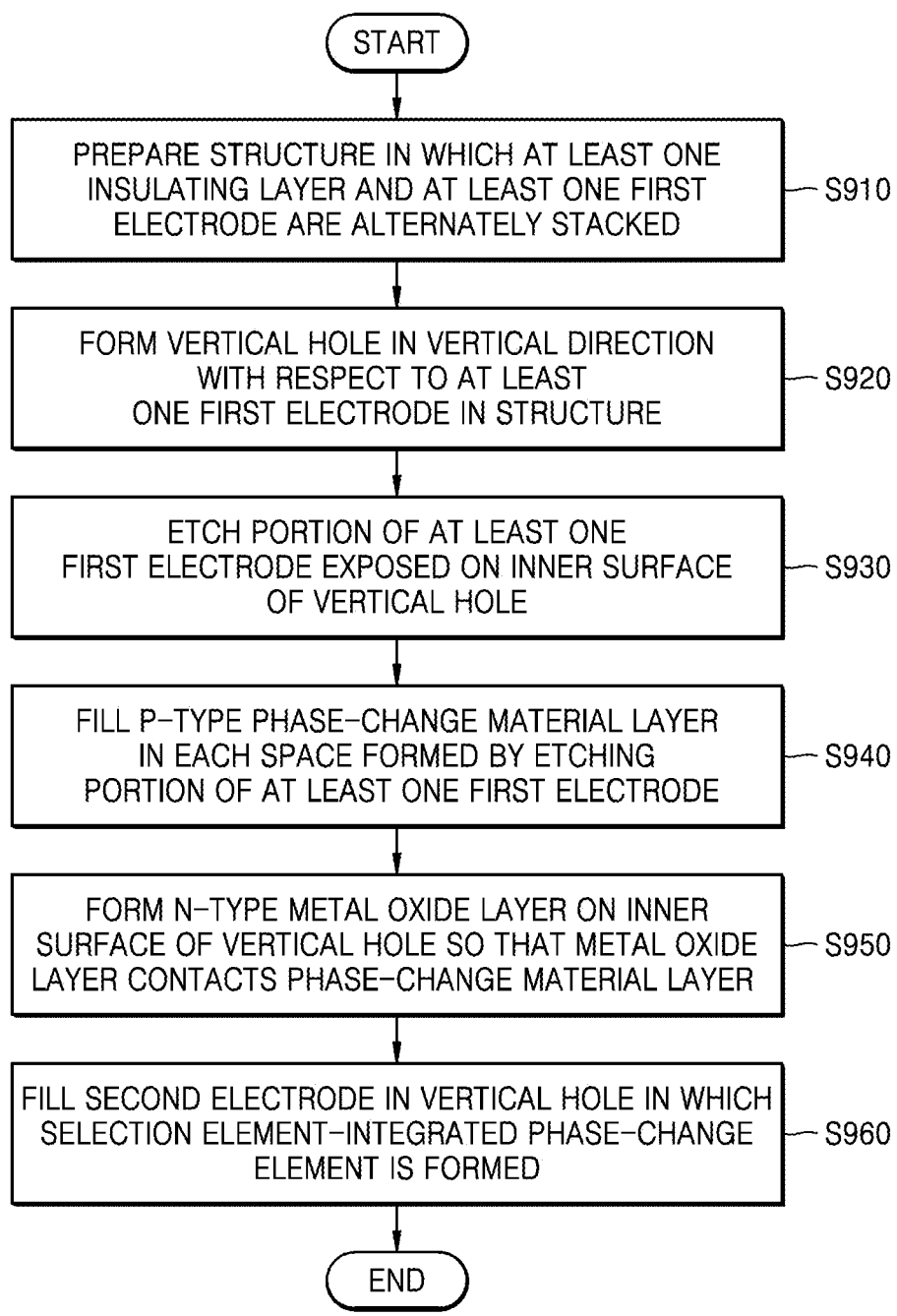
FIG. 9 is a flowchart showing a method of producing a phase-change memory, according to an embodiment.

FIG. 9 is a flowchart showing a method of producing a phase-change memory, according to an embodiment. FIGS. 10 through 15 are views for explaining a method of producing a phase-change memory, according to an embodiment.

Referring to FIGS. 9 through 15, a method of producing a phase-change memory according to an embodiment relates to the method of producing a phase-change memory implemented to have a highly integrated three-dimensional architecture described above with reference to FIG. 8 and is performed by a production system.

Figure 10:
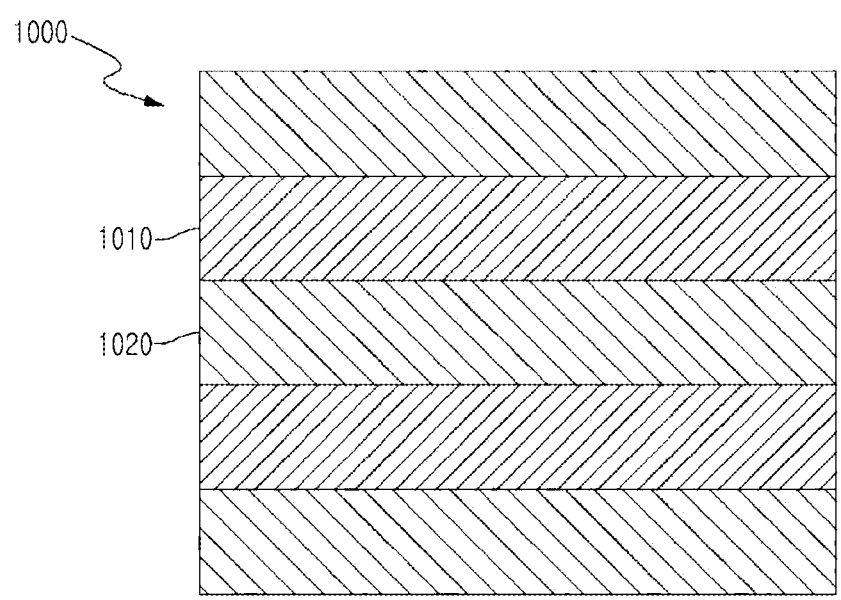
FIGS. 10 through 15 are views for explaining a method of producing a phase-change memory, according to an embodiment.

In operation S910, as shown in FIG. 10, the production system prepares a structure 1000 in which at least one insulating layer 1020 and at least one first electrode 1010 extending in a horizontal direction are alternately stacked.

Figure 11:
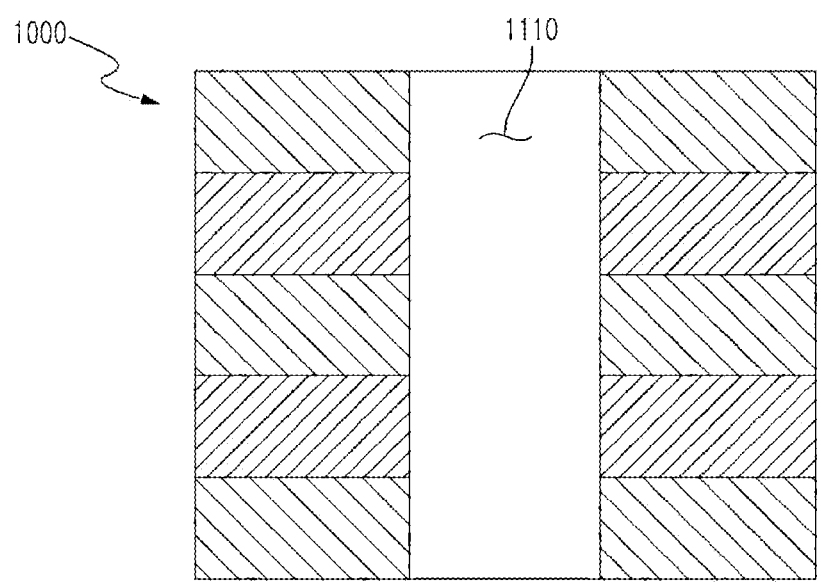

In operation S920, as shown in FIG. 11, the production system forms, in the structure 1000, at least one vertical hole 1110 in a vertical direction with respect to the at least one first electrode 1010.

Figure 12:
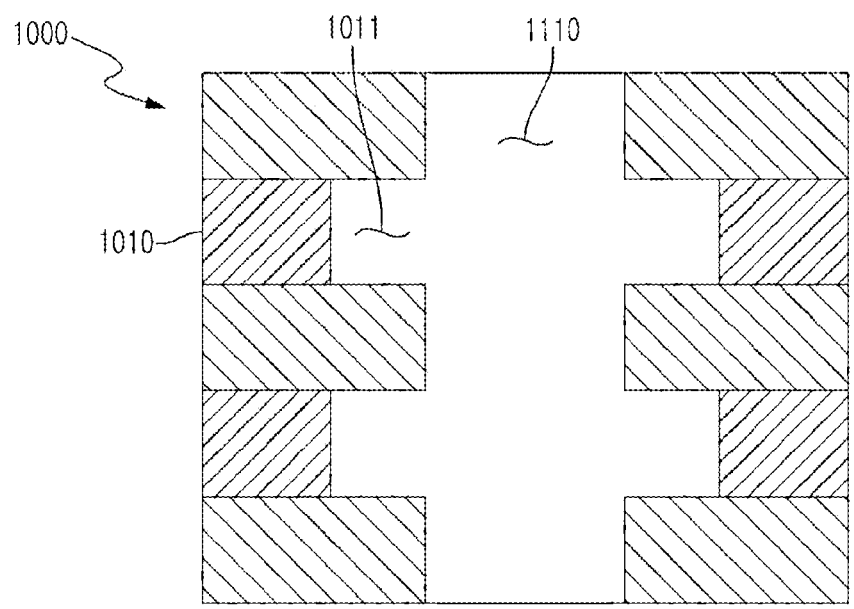

In operation S930, as shown in FIG. 12, the production system forms a space 1011 having an etched portion by etching a portion of the at least one first electrode 1020 exposed on an inner surface of the vertical hole 1110.

Figure 13:
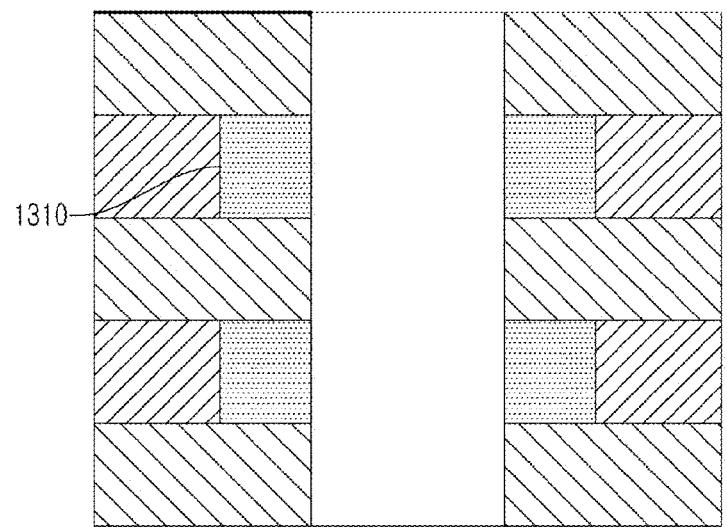
Figure 14:
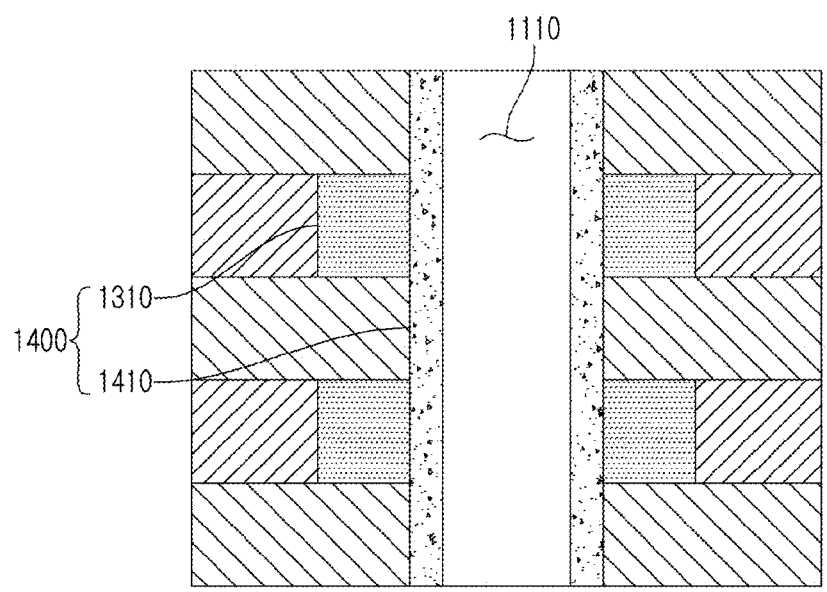

In operation S940, the production system forms a selection element-integrated phase-change element in a PN diode structure in the space 1011, which is formed by etching the portion of the at least one first electrode 1010, and on the inner surface of the vertical hole 1110. In more detail, the production system fills a P-type phase-change material layer 1310 in each space 1011 formed by etching the portion of the at least one first electrode 1010 in operation S941 as shown in FIG. 13, forms an N-type metal oxide layer 1410 on the inner surface of the vertical hole 1110 so that the metal oxide layer 1410 contacts the phase-change material layer 1310 in operation S942 as shown in FIG. 14, thereby forming a selection element-integrated phase-change element 1400 including the P-type phase-change material layer 1310 and the N-type metal oxide layer 1410 in operation S940.

Here, the P-type phase-change material layer 1310 may be formed of a compound in which a transition metal (e.g., a material including at least one of Cr, Ti, Ni, Zn, Cu, and/or Mo) is included in a phase-change material (e.g., a material including at least one of Ge, Sb, or Te), thereby having a reverse phase-change characteristic in which the phase-change material layer 1310 has high resistance when a crystal state thereof is crystalline and has low resistance when the crystal state thereof is amorphous. A composition ratio in which the transition metal is included in the phase-change material in the phase-change material layer 1310 may be adjusted to maximize a resistance ratio of the phase-change material layer 1310 between when the crystal state thereof is crystalline and when the crystal state thereof is amorphous.

The N-type metal oxide layer 1410 may be formed of an oxide semiconductor material including at least one cation of Zn, In, or Ga. For example, the N-type metal oxide layer 1410 may be formed of a $ZnO_x$-based material (e.g., a material including at least one of AZO, ZTO, IZO, ITO, IGZO, or Ag—ZnO).

Figure 15:
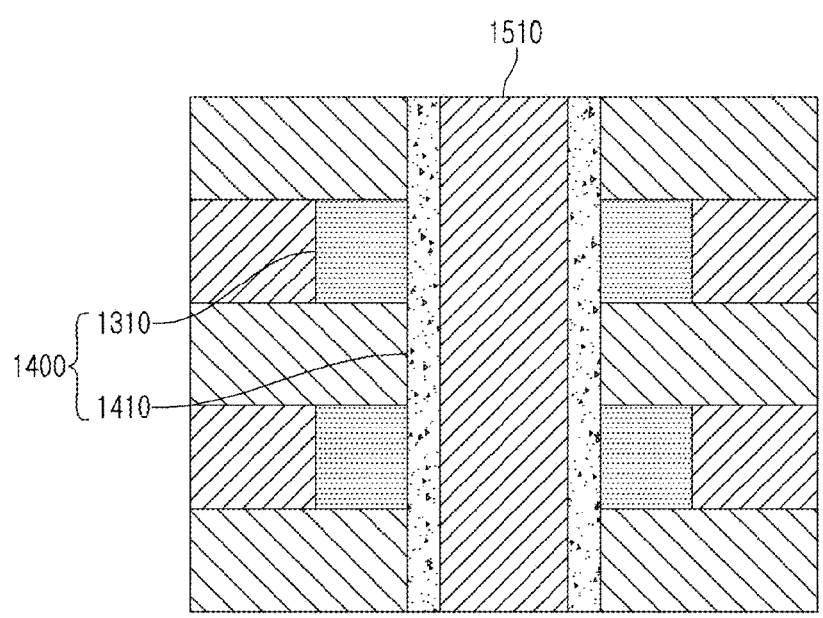

In operation S950, as shown in FIG. 15, the production system fills a second electrode 1510 in the vertical hole 1110 in which the selection element-integrated phase-change element 1400 is formed.

Figure 16:
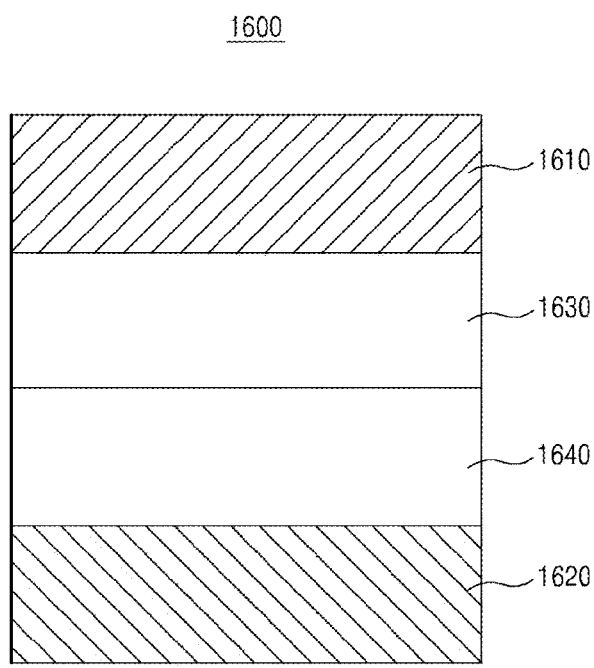
FIG. 16 is a view showing a phase-change memory device according to an embodiment.
Figure 17:
FIG. 17 is a view for explaining a selection element according to an embodiment.
Figure 18:
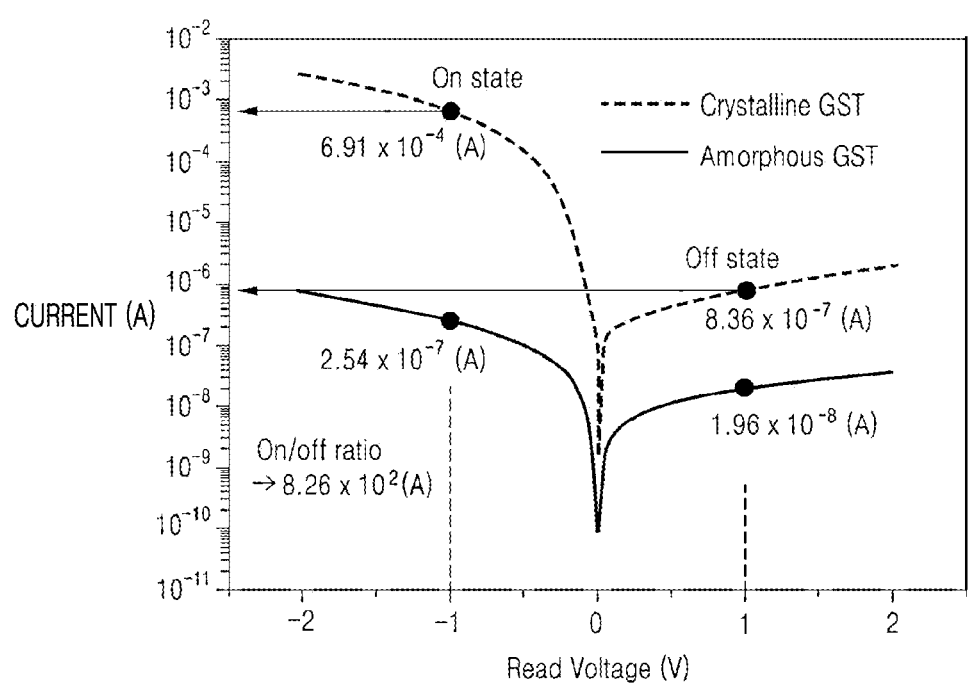
FIG. 18 is a view for explaining characteristics of a selection element according to an embodiment.
Figure 19:
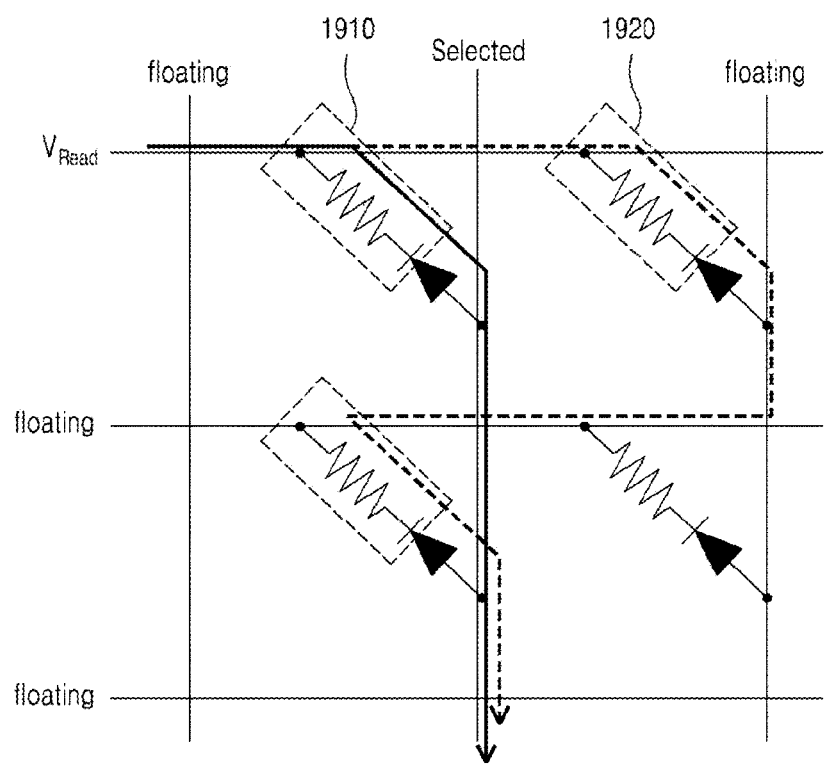
FIGS. 19 and 20 are views for explaining merits of a phase-change memory device according to an embodiment.
Figure 20:
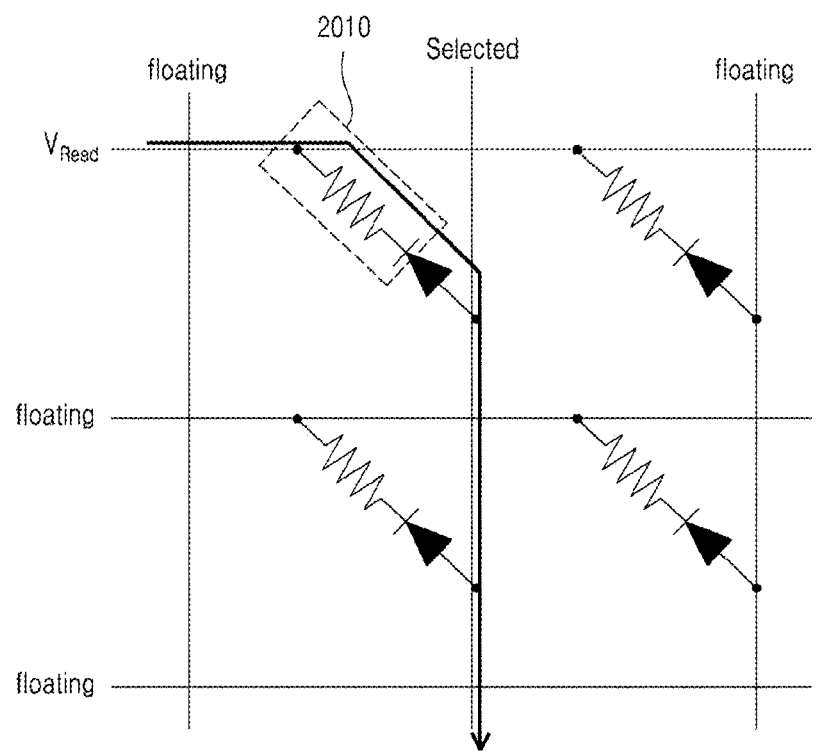

FIG. 16 is a view showing a phase-change memory device according to an embodiment. FIG. 17 is a view for explaining a selection element according to an embodiment. FIG. 18 is a view for explaining characteristics of a selection element according to an embodiment. FIGS. 19 and 20 are views for explaining merits of a phase-change memory device according to an embodiment.

Referring to FIGS. 16 through 20, a phase-change memory device 1600 according to an embodiment includes a first electrode 1610, a second electrode 1620, a phase-change material layer 1630, and a semiconductor material layer 1640.

Each of the first electrode 1610 and the second electrode 1620 may be formed of a metal material having conductivity such as W, TaN, or TiN. As shown in FIG. 16, the first electrode 1610 and the second electrode 1620 are arranged on and below the phase-change material layer 1630, and thus, may be referred to as a top electrode and a bottom electrode, respectively. In particular, as will be described later, the first electrode 1610 and the second electrode 1620 may be formed of a P-type metal material so that an interface with one of the first electrode 1610 and the second electrode 1620 forms a PN diode structure along with the semiconductor material layer 1640.

The phase-change material layer 1630 is between the first electrode 1610 and the second electrode 1620 and is formed of a phase-change material so that a crystal state thereof is changed due to heat supplied from the first electrode 1610 and the second electrode 1620 (heat generated by a current flow between the first electrode 1610 and the second electrode 1620 or a difference in an applied voltage), thereby functioning as a memory cell.

For example, the phase-change material layer 1630 is formed of a phase-change material (Ge2Sb2Te5) such as Ge, Sb and/or Te to show a phase-change characteristic in which the phase-change material layer 1630 has low resistance when a crystal state thereof is crystalline and has high resistance when the crystal state thereof is amorphous. Here, having low resistance when the crystal state of the phase-change material layer 1630 is crystalline indicates having relatively low resistance on the basis of resistance obtained when the crystal state of the phase-change material layer 1630 is amorphous, and having high resistance when the crystal state of the phase-change material layer 1630 is amorphous indicates having relatively high resistance on the basis of resistance obtained when the crystal state of the phase-change material layer 1630 is crystalline In other words, having low resistance or high resistance according to the crystal state of the phase-change material layer 1630 may indicate that relatively compared resistance values are high or low The semiconductor material layer 1640 is arranged between one of the first electrode 1610 or the second electrode 1620 and the phase-change material layer 1630 and operates as a selection element for the phase-change material layer 1630 by using Schottky diode characteristics of a contact interface with one of the first electrode 1610 or the second electrode 1620. Hereinafter, when the semiconductor material layer 1640 operates as the selection element for the phase-change material layer 1630, the semiconductor material layer 1640 performs an operation of selectively switching, to the phase-change material layer 1630, heat supplied from the first electrode 1610 and the second electrode 1620.

In more detail, when the semiconductor material layer 1640 is formed N type, and one of the first electrode 1610 or the second electrode 1620 is formed P type, one of the first electrode 1610 or the second electrode 1620 and the semiconductor material layer 1640 may form a PN diode structure as shown in FIG. 17 (FIG. 17 is a view showing an equivalent circuit of the phase-change material layer 1630 and the semiconductor material layer 1640). Therefore, the semiconductor material layer 1640 having the PN diode structure at the contact interface with one of the first electrode 1610 or the second electrode 1620 may function as a selection element for selectively switching, to the phase-change material layer 1630, heat supplied from the first electrode 1610 and the second electrode 1620.

Here, the semiconductor material layer 1640 may be formed of an N-type oxide semiconductor material including at least one cation of Zn In, or Ga having a low leakage current characteristic, thereby achieving a high leakage current characteristic with a wide band gap. For example, the semiconductor material layer 1640 may be formed of a $ZnO_x$-based material including at least one of AZO, ZTO, IZO, ITO, IGZO, or Ag—ZnO.

The semiconductor material layer 1640 forming the PN diode structure at the contact interface with one of the first electrode 1610 or the second electrode 1620 may have a very fast switching characteristic as shown in FIG. 18 by using the Schottky diode characteristics, thereby functioning as the selection element for selectively switching heat to the phase-change material layer 130 in the phase-change memory device 1600.

Also, the semiconductor material layer 1640 according to an embodiment does not need an additional intermediate electrode, and thus, the phase-change memory device 1600 including the semiconductor material layer 1640 may improve integration in scaling.

In an existing phase-change memory which does not include the semiconductor material layer 1640 according to an embodiment and in which phase-change material layers are arrayed, as shown in FIG. 19, in a process of reading a selected phase-change material layer 1910, a leakage current may flow into unselected phase-change material layers 1920 and 1930. However, a phase-change memory which includes the semiconductor material layer 1640 according to an embodiment and in which phase-change material layers are arrayed may block a leakage current by flowing a current merely in a selected phase-change material layer 2010 and performing reading.

Figure 21:
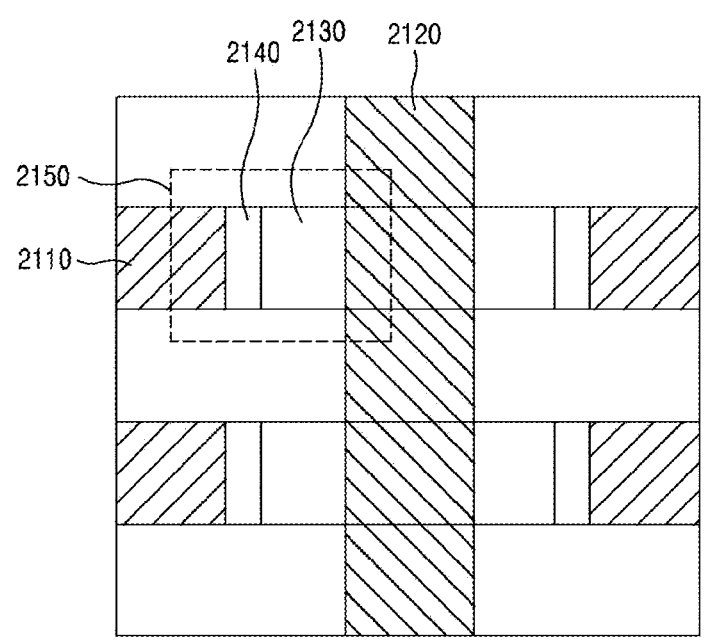
FIG. 21 is a view showing a phase-change memory implemented to have a highly integrated three-dimensional architecture while including a selection element, according to an embodiment

FIG. 21 is a view showing a phase-change memory implemented to have a highly integrated three-dimensional architecture while including a selection element, according to an embodiment.

Referring to FIG. 21, a phase-change memory 2100 implemented to have a three-dimensional architecture, according to an embodiment, includes at least one first electrode 2110 extending in a horizontal direction, a second electrode 2120 extending in a vertical direction with respect to the at least one first electrode 2110, at least one phase-change material layer 2130 between the at least one first electrode 2110 and the second electrode 2120, and at least one semiconductor material layer 2140 arranged between one of the at least one first electrode 2110 or the second electrode 2120 and the at least one phase-change material layer 2130.

In the phase-change memory 2100 having the above-described structure, an area 2150 corresponds to the phase-change memory device described above with reference to FIGS. 16 through 20. In other words, the phase-change memory 2100 may be implemented as a three-dimensional architecture including a plurality of phase-change memory devices, thereby selectively driving each of the plurality of phase-change memory devices according to a switching operation of a semiconductor material layer corresponding to each of the plurality of phase-change memory devices.

As described above, the at least one semiconductor material layer 2140 is arranged between the at least one first electrode 2110 and the at least one phase-change material layer 2130 in a number corresponding to the at least one phase-change material layer 2130 but is not limited thereto. Like the second electrode 2120, the at least one semiconductor material layer 2140 may extend singly in a vertical direction with respect to the first electrode 2110 to be arranged between the second electrode 2120 and the at least one phase-change material layer 2130. In this case, the at least one semiconductor material layer 2140 may perform a switching operation for each area corresponding to the at least one phase-change material layer 2130 to selectively supply heat to each of the at least one phase-change material layer 2130.

Although the embodiments have been described above by the limited embodiments and drawings, it will be understood by one of ordinary skill in the art that various modifications and variations may be made from the above description. For example, although the described technologies are performed in a different order from the described method, and/or components such as the described system, structure, device, circuit, and the like are coupled or combined in a form different from the described method, or substituted or replaced by other components or equivalents, appropriate results may be achieved.

Therefore, other implementations, other embodiments, and equivalents to claims pertain to the scope of claims that will be described below.

The invention claimed is:

1. A selection element-integrated phase-change element used in a phase-change memory device, the selection element-integrated phase-change element comprising:
 a phase-change material layer of P type having a crystal state changing due to heat supplied from a first electrode and a second electrode included in the phase-change memory device; and
 a metal oxide layer of N type contacting the phase-change material layer,
 wherein the selection element-integrated phase-change element is formed in a PN diode structure to selectively switch, to the phase-change material layer, heat supplied from the first electrode and the second electrode.

2. The selection element-integrated phase-change element of claim 1, wherein the metal oxide layer is formed of an oxide semiconductor material including at least one cation of Zn, In, or Ga.

3. The selection element-integrated phase-change element of claim 2, wherein the metal oxide layer is formed of a $ZnO_x$-based material.

4. The selection element-integrated phase-change element of claim 3, wherein the $ZnO_x$-based material includes at least one of AZO, ZTO, IZO, ITO, IGZO, or Ag—ZnO.

5. The selection element-integrated phase-change element of claim 1, wherein the phase-change material layer is formed of a compound, in which a transition metal is included in a phase-change material, to have a reverse phase-change characteristic in which the phase-change material layer has high resistance when a crystal state thereof is crystalline and has low resistance when the crystal state thereof is amorphous.

6. The selection element-integrated phase-change element of claim 5, wherein a composition ratio in which the transition metal is included in the phase-change material is adjusted to maximize a resistance ratio of the phase-change material layer between when the crystal state thereof is crystalline and when the crystal state thereof is amorphous.

7. The selection element-integrated phase-change element of claim 5, wherein the phase-change material includes at least one of Ge, Sb, or Te, and
 the transition metal includes at least one of Cr, Ti, Ni, Zn, Cu, or Mo.

8. A method of producing a selection element-integrated phase-change element used in a phase-change memory device, the method comprising:
 forming a phase-change material layer of P type having a crystal state changing due to heat supplied from a first electrode and a second electrode included in the phase-change memory device; and
 forming a metal oxide layer of N type so that the metal oxide layer contacts the phase-change material layer,
 wherein the selection element-integrated phase-change element is formed in a PN diode structure to selectively switch, to the phase-change material layer, heat supplied from the first electrode and the second electrode.

9. A phase-change memory device comprising:
 a first electrode;
 a second electrode;
 a phase-change material layer between the first electrode and the second electrode; and
 a semiconductor material layer arranged between one of the first electrode or the second electrode and the phase-change material layer and operating as a selection element for the phase-change material layer by using Schottky diode characteristics of a contact interface with the one electrode.

10. The phase-change memory device of claim 9, wherein the one electrode and the semiconductor material layer form a PN diode structure to selectively switch, to the phase-change material layer, heat supplied from the first electrode and the second electrode.

11. The phase-change memory device of claim 10, wherein the one electrode and the semiconductor material layer have a PN diode structure as the one electrode is formed P type and the semiconductor material layer is formed N type.

12. The phase-change memory device of claim 10, wherein the semiconductor material layer is formed of an N-type oxide semiconductor material including at least one cation of Zn, In, or Ga.

13. The phase-change memory device of claim 12, wherein the semiconductor material layer is formed of a $ZnO_x$-based material.

14. The phase-change memory device of claim 13, wherein the $ZnO_x$-based material includes at least one of AZO, ZTO, IZO, ITO, IGZO, or Ag—ZnO.

* * * * *